United States Patent
Kuriyama et al.

[11] Patent Number: 5,461,539
[45] Date of Patent: Oct. 24, 1995

[54] HEAT SENSITIVE ELECTRONIC COMPONENT

[75] Inventors: Chojiro Kuriyama; Eisaku Tanaka, both of Kyoto, Japan

[73] Assignee: Rohm Co., Ltd., Kyoto, Japan

[21] Appl. No.: 386,337

[22] Filed: Feb. 10, 1995

Related U.S. Application Data

[63] Continuation of Ser. No. 164,572, Dec. 10, 1993, abandoned.

[30] Foreign Application Priority Data

Dec. 28, 1992 [JP] Japan .................................. 4-349206

[51] Int. Cl.[6] .................................................. H01G 9/06
[52] U.S. Cl. ........................ 361/534; 174/52.2; 257/729; 257/788; 340/691; 361/719; 361/773; 361/275.4
[58] Field of Search ................................... 174/112, 52.2; 337/1, 5, 241, 243; 116/207, 216, 217; 340/584, 590, 638, 653, 664, 691; 257/729, 665, 788, 787, 690, 701, 702, 678; 361/303, 310, 679, 688, 704, 713, 714, 718, 719, 722, 760, 767, 772, 773, 783, 807–809, 275.4, 275.1, 534, 539, 540, 301.3

[56] References Cited

U.S. PATENT DOCUMENTS

| | | | |
|---|---|---|---|
| 3,653,959 | 4/1972 | Kehr | 117/201 |
| 4,225,659 | 9/1980 | Drexler | 430/5 |
| 4,358,955 | 11/1982 | Rait | 73/295 |
| 4,424,990 | 1/1984 | White | 285/381 |
| 4,745,457 | 5/1988 | Morgan | 357/80 |
| 4,786,773 | 11/1988 | Keefer | 219/10.55 E |
| 4,922,242 | 5/1990 | Parker | 340/786 |
| 4,985,751 | 1/1991 | Shiobara | 357/72 |
| 5,068,062 | 11/1991 | Inata | 252/518 |
| 5,128,616 | 7/1992 | Palmer | 324/435 |
| 5,216,584 | 6/1993 | Okazaki | 361/534 |

FOREIGN PATENT DOCUMENTS

| | | | |
|---|---|---|---|
| 488130 | 6/1992 | European Pat. Off. | |
| 2534668 | 2/1977 | Germany . | |
| 4-48754 | 2/1992 | Japan . | |
| 5067543 | 3/1993 | Japan | 361/534 |

OTHER PUBLICATIONS

Handbook of Microelectronics Packaging and Interconnection Technologies, Electrochemical Publ. Ltd., 1985, pp. 54–55.

*Primary Examiner*—Gerald P. Tolin
*Attorney, Agent, or Firm*—William H. Eilberg

[57] ABSTRACT

An electronic component is provided which comprises a resin package for enclosing inside parts. The package has a heat sensitive surface portion provided with a heat sensitive material which irreversibly discolors at a temperature higher than the soldering temperature for the electronic component. The component may be a solid tantalum capacitor, solid aluminum capacitor, diode or transistor which generates heat under abnormal operating conditions.

3 Claims, 1 Drawing Sheet

HEAT SENSITIVE ELECTRONIC COMPONENT

This application is a continuation of application Ser. No. 08/164,572, filed Dec. 10, 1993, now abandoned.

BACKGROUND OF THE INVENTION

1. Field of the Invention

This invention relates to a heat sensitive electronic component, such as solid tantalum capacitor, solid aluminum capacitor, diode or transistor, which is broken down upon abnormal heat generation of its own or under excessive thermal load from outside.

2. Description of the Prior Art

The solid tantalum capacitor is known as a polar component having an anode and a cathode. Therefore, if a tantalum capacitor is mounted on a printed circuit board with inverse polarity, it will generate a lot of heat and thereby break down. Further, a solid tantalum capacitor with a safety fuse is designed to break down when the fuse is melt-cut upon overcurrent or overheat.

However, such a breakdown of the solid tantalum capacitor is not visually recognizable. Thus, if the tantalum capacitor is thermally broken down after mounting to a printed circuit board, it is extremely laborious to locate the broken capacitor among various components on the same circuit board.

A similar problem also holds true with respect to diodes and solid aluminum capacitors which are also polar and break without any change in appearance. Further, transistors are also known to abnormally generate heat and thereby break down without any change in appearance.

SUMMARY OF THE INVENTION

It is, therefore, an object of the present invention to provide a heat sensitive electronic component, such as solid tantalum capacitor, solid aluminum capacitor, diode or transistor, which provides a ready visual recognition as to whether the component is thermally broken down.

According to the present invention, there is provided a heat sensitive electronic component comprising a resin package for enclosing inside parts, wherein the package has a heat sensitive surface portion provided with a heat sensitive material which irreversibly discolors at a temperature higher than a soldering temperature for the electronic component.

According to the arrangement described above, the heat sensitive surface portion, namely, the heat sensitive material, discolors irreversibly upon abnormal heat generation of its own or under excessive thermal load while preventing discoloration at the time of mounting the component to a printed circuit board by soldering. Apparently, such discoloration provides a quick visual recognition if the component is thermally broken down, thereby reducing the time and labor for breakdown inspection.

According to a preferred embodiment of the present invention, the electronic component further comprises an exposed positive lead portion and an exposed native lead portion, and the heat sensitive surface portion is located offset toward one of the respective exposed lead portions. Apparently, the offset location of the heat sensitive surface portion indicates the polarity of the component, thereby preventing the polar component from being mounted with inverse polarity.

Other objects, features and advantages of the present invention will be fully understood from the following detailed description given with reference to the accompanying drawings.

DETAILED DESCRIPTION OF THE PREFERRED EMBODIMENTS

Figure 1:
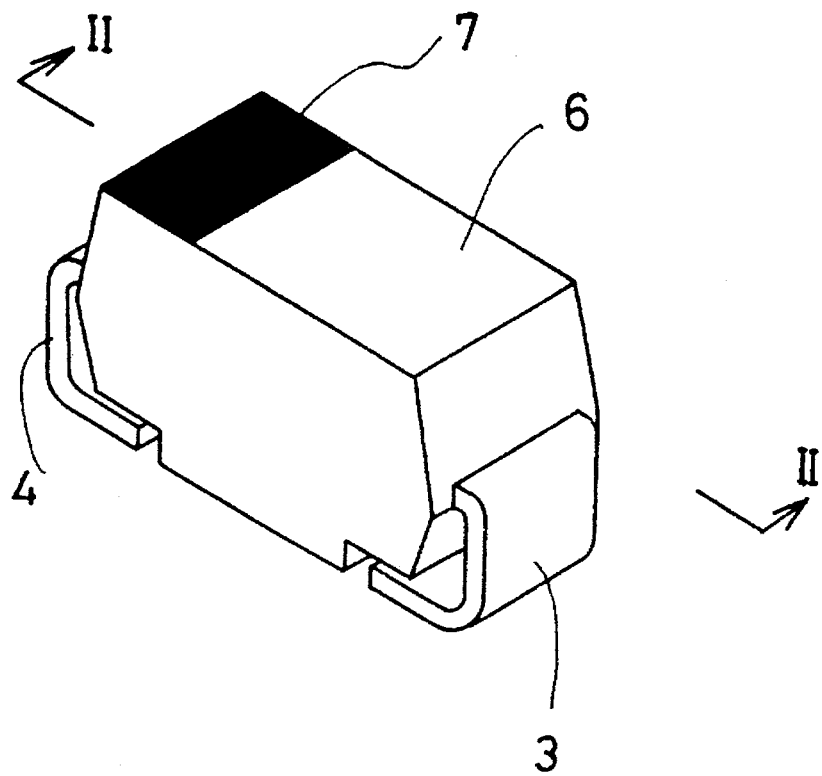
FIG. 1 is a perspective view showing a tantalum capacitor chip as an embodiment of the present invention.
Figure 2:
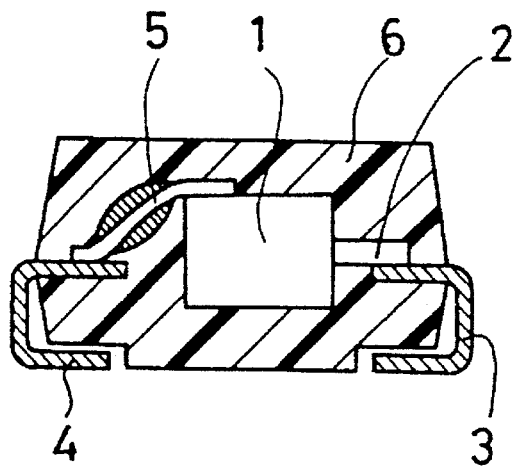
FIG. 2 is a sectional view taken on line II—II in FIG. 1.

Referring to the accompanying drawings, there is shown a solid tantalum capacitor as an embodiment of the present invention. The illustrated capacitor comprises a capacitor chip 1 having an anode wire 2 partially projecting from and partially inserted in the body of the chip 1. The anode wire 2 is electrically connected to an anode lead (positive lead) 3, whereas the body of the chip 1 is electrically connected to a cathode lead (negative lead) 4 through a safety fuse wire 5. The fuse wire 5 may be in the form of a temperature fuse wire which is designed to break at a predetermined high temperature, or in the form of an overcurrent fuse wire which is adapted to break upon passage of a predetermined overcurrent.

The capacitor chip 1 together with the safety fuse wire 5 and part of the anode and cathode leads 3, 4 is enclosed in a resin package 6. The exposed portions of the respective leads 3, 4 are bent under the package 6 for surface mounting to a printed circuit board (not shown). The package 6 may be made of a thermosetting resin for example.

According to the illustrated embodiment, the resin package 6 has an upper surface portion 7 to which is applied a heat sensitive material for irreversibly discoloring (color-changing) at a predetermined temperature (e.g. 260° C.) which is higher than that required for soldering the capacitor to the unillustrated circuit board. Preferably, the heat sensitive surface portion 7 is located offset toward the cathode lead 4.

The temperature at which the heat sensitive surface portion 7 of the resin package 6 changes its color may lie in a range of 200°–300° C. If the discoloring temperature is below 200° C., the surface surface portion 7 may unexpectedly discolor at the time of soldering the capacitor. The upper limit of 300° C. is selected because the capacitor may start burning above this temperature.

Examples of heat sensitive material include cobalt oxalate, talc $(Mg_3(Si_4O_{10})(OH)_2)$, zinc white (ZnO), molybdenum oxide and etc. Either of these compounds may be used in combination with a binder and suitable additives depending on the required color and discoloring temperature.

Due to the setting of the discoloring temperature described above, the heat sensitive surface portion 7 of the resin package 6 does not discolor at the time of mounting the capacitor by soldering. However, when the capacitor is abnormally heated above the discoloring temperature due to the inverse polarity mounting of the capacitor or due to an overcurrent which results in thermal melting of the safety fuse wire 5, the heat sensitive surface portion 7 discolors irreversibly to visually indicate the breakdown of the capacitor. Further, the offset location of the heat sensitive surface portion 7 indicates the position of the cathode lead 4, thereby preventing erroneous mounting of the capacitor with respect to its polarity.

The heat sensitive surface portion 7 may be in the form of a marking which represents the capacitance or other properties of the capacitor. Further, the heat sensitive surface portion 7 may be located centrally on top of the package 6 or offset toward the anode lead 3.

The present invention being thus described, it is obvious that the same may be varied in many ways. For instance, the present invention is not limited to the solid tantalum capacitor described above but may be equally applicable to solid aluminum capacitors, diodes, transistors and etc. Such variations are not to be regarded as a departure from the spirit and scope of the present invention, and all such modifications as would be obvious to those skilled in the art are intended to be included within the scope of the following claims.

We claim:

1. A heat sensitive capacitor comprising:

a resin package having a first end, a second end opposite to the first end face, and a top surface;

a capacitor element enclosed in the package and having two poles;

a first lead electrically connected to one of the poles and projecting from the first end of the package; and a second lead electrically connected to the other of the poles through a fuse and projecting from the second end of the package;

wherein the top surface of the resin package has a heat sensitive end portion provided with a heat sensitive material which irreversibly discolors at a fuse melting temperature higher than a soldering temperature for the capacitor element; and wherein the heat sensitive end portion of the top surface of the package is located adjacent to one of the first and second ends and extends only up to a position short of a middle point between the first and second ends.

2. The capacitor according to claim 1, wherein the heat sensitive material is made to discolor at a temperature which lies in a range of 200°–300° C.

3. The capacitor according to claim 1, wherein the heat sensitive material is selected from the group consisting of cobalt oxalate, talc, zinc white and molybdenum oxide.

* * * * *